US00RE35379E

United States Patent [19]

Nicollini

[11] E Patent Number: Re. 35,379

[45] Reissued Date of Patent: Nov. 19, 1996

[54] COMPLETELY DIFFERENTIAL FILTER WITH SWITCHED CONDENSERS USING CMOS OPERATIONAL AMPLIFIERS WITH NO COMMON-MODE FEEDBACK

[75] Inventor: Germano Nicollini, Piacenza, Italy

[73] Assignee: SGS Thomson Microelectronics S.r.l., Agrate Brianza, Italy

[21] Appl. No.: 189,576

[22] Filed: Jan. 28, 1994

Related U.S. Patent Documents

Reissue of:

[64] Patent No.: 5,084,683
Issued: Jan. 28, 1992
Appl. No.: 453,921
Filed: Dec. 19, 1989

[30] Foreign Application Priority Data

Dec. 22, 1988 [IT] Italy ..... 23059/88

[51] Int. Cl.[6] ..... H03F 1/34

[52] U.S. Cl. ..... 330/107; 330/109

[58] Field of Search ..... 330/9, 51, 69, 330/107, 109, 253, 258

[56] References Cited

U.S. PATENT DOCUMENTS 4,533,877 8/1985 Rahim ..... 330/253
4,574,250 3/1986 Senderowicz ..... 330/253
4,609,877 9/1986 Nicollini et al. ..... 330/51
4,918,399 4/1990 Devecchi et al. ..... 330/258 X
4,920,325 4/1990 Nicollini et al. ..... 330/109 X

FOREIGN PATENT DOCUMENTS 00293020 11/1988 European Pat. Off. .

OTHER PUBLICATIONS

Maloberti, F., et al., "Low-Noise Time-Shared Differential Switched-Capacitor Ladder Filters", IEEE 1983 Symp. CRTs and Systems, vol. 2, pp. 559-566.

*Primary Examiner*—Steven J. Mottola
*Attorney, Agent, or Firm*—David M. Driscoll; James H. Morris; John N. Anastasi

[57] ABSTRACT

The filter comprises at least one completely differential operational amplifier having two inputs and two outputs and at least one pair of feedback circuits connecting said outputs with respective inputs of said amplifier outside of same. The operational amplifier has no common-mode feedback circuit, whose functions are performed by said feedback circuits external to the amplifier.

20 Claims, 2 Drawing Sheets

COMPLETELY DIFFERENTIAL FILTER WITH SWITCHED CONDENSERS USING CMOS OPERATIONAL AMPLIFIERS WITH NO COMMON-MODE FEEDBACK

Matter enclosed in heavy brackets [ ] appears in the original patent but forms no part of this reissue specification; matter printed in italics indicates the additions made by reissue.

DESCRIPTION

The present invention relates to a completely differential filter with switched condensers using CMOS operational amplifiers with no common-mode feedback.

The switched condenser technique (hereinafter called SC) represents the most popular analog approach for the implementation of high-precision filtering functions in commercial-type integrated circuits. The main reasons for the success of the SC technique are the following: a) resistors of large size can be replaced with very small switched condensers; b) it is possible to accomplish very accurate filtering time constants, given that they depend on capacitative ratios which are very well controlled in integrated circuits and on a clock frequency which can be generated accurately by a crystal oscillator.

Up to now this technique has been shown to be effective in accomplishing audio band filters and there is now great demand to extend it to frequencies above the audio range, up to video band frequencies, for intermediate frequency filtering devices in heterodyne and double-heterodyne systems and television products for the consumer. The maximum central frequencies (in the case of band-pass or band-stop filters) and of band-limit frequencies (in the case of low-pass or high-pass filters) obtainable in SC filters are limited by the ability of the operational amplifiers used in the above filters to attain the desired final value within half a clock period. As a consequence, high-frequency filters always require operational amplifiers with a wide unit-gain bandwidth, a high direct current open-mesh gain (for applications having a high Q value) and a good slew rate.

A second important request in the accomplishment of SC filters consists in the use of a supply voltage of 5 V, so as to take advantage of technological progress and of analog/digital compatibility. Thus the dynamic field and the suppression of the power supply are also highly important design parameters.

Recently, high-frequency filters with a high Q value have been accomplished successfully by selecting very simple topologies and a completely differential structure of the operational amplifier and exploiting recent technological improvements related to short-channel processes. Completely differential operational amplifiers are preferred over their unbalanced counterparts because they determine a wider dynamic field and a greater suppression of noise due to the power supply and to the clock signal passage. The main disadvantages of the completely differential approach consist, on the other hand, in the greater demand for area and for power due to the common-mode feedback circuit hereinafter called CMFB) of the operational amplifier and in the limitation of the filtering rate due to the load of the CMFB circuit on the differential path.

In view of this state of the art, the object of the present invention is to accomplish a completely differential filter, suitable for implementation in an integrated circuit, which does not suffer from the drawbacks indicated above due to the common mode feedback circuit of the operational amplifier.

According to the invention such object is attained with a filter comprising at least one completely differential operational amplifier having two inputs and two outputs and at least one pair of feedback circuits of the differential signal arranged to connect said outputs with respective inputs of said amplifier outside of same, characterized in that said operational amplifier has no common-mode feedback circuit and in that the latter's function is performed by said pair of feedback circuits external to said amplifier.

In this way the drawbacks mentioned above due to the operational amplifier's CMFB circuits are overcome without losing the indispensable common-mode feedback function. This allows the accomplishment of a completely differential filter having a smaller area, reduced power dissipation, greater rates of operation and a greater dynamic field.

The characteristics of the present invention shall be made evident to a greater extent by the following detailed description of its embodiments illustrated, as nonlimiting examples, in the enclosed drawings, wherein.

Figure 1:
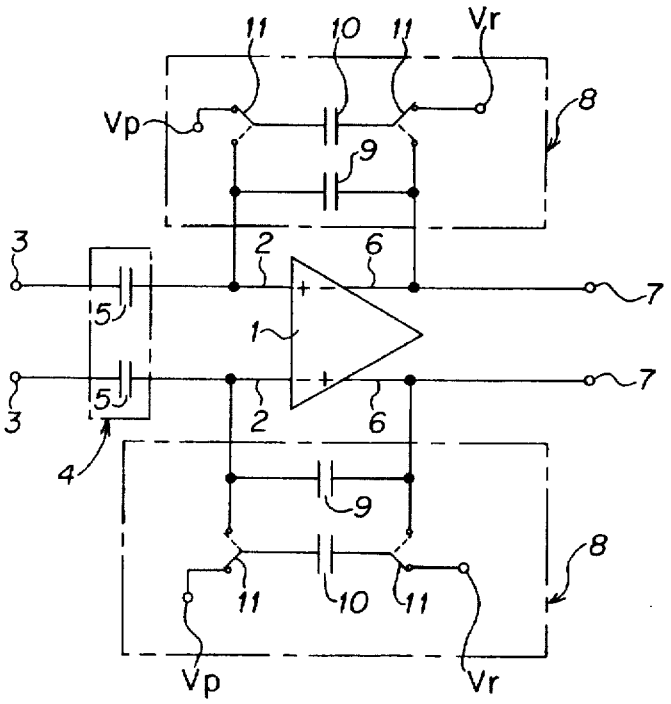
FIG. 1 shows the overall block diagram of a completely differential filter of the first order, accomplished according to the invention.

FIG. 1 shows a completely differential SC filter of the first order, which in a mode known in itself (say, in the U.S. Pat. No. 4,609,877 and in the European Patent Application No. 0293020 by the same Applicant) comprises an operational amplifier 1 having two inputs 2 connected to respective signal inputs 3 by means of a connecting network 4 formed by condensers 5, as well as two outputs 6 directly connected to respective signal outputs 7.

Outputs 6 of operational amplifier 1 are connected to inputs 2 of the same amplifier by means of respective negative feedback circuits 8, each of which consists of a first condenser 9 constantly connected between output 6 and input 2 and of a second condenser 10 alternatively connected between a terminal of polarization voltage Vp and a terminal of reference voltage Vr according to the position of a pair of switches 11.

With switches 11 in the position illustrated by a continuous line condensers 10 are suitably charged at a voltage Vp–Vr, while in the subsequent phase with the switches 11 in the position illustrated by a dotted line condensers 10 are connected in parallel with condensers 9.

The manner of operation of the filter of FIG. 1 and of its variations is described in the U.S. Patent and in the European Patent Application mentioned above.

With respect to such known solutions, however, the filter according to the invention distinguishes itself in that the completely differential operational amplifier 1 does not include the usual common-mode feedback circuit.

Such function, in fact, is performed by the same negative feedback circuits 8 already normally present in the filter.

Figure 2:
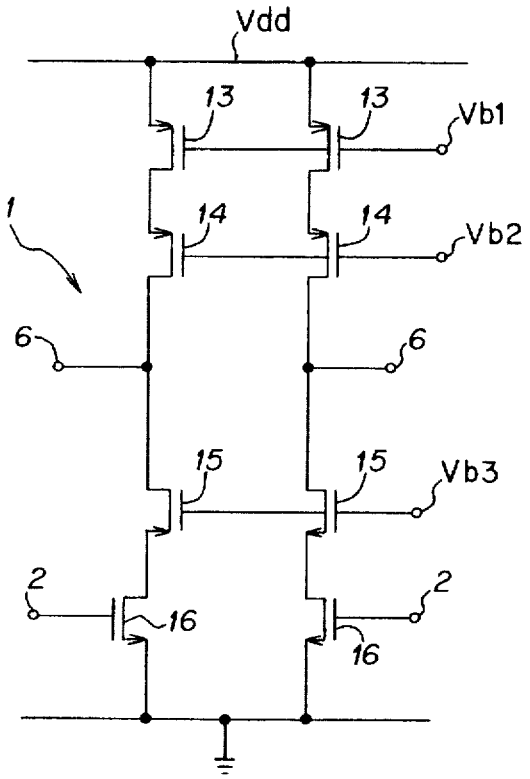
FIG. 2 shows the circuit details of a possible CMOS operational amplifier included in the filter of FIG. 1.

A suitable operational amplifier circuit accomplished with CMOS technology can thus be that of FIG. 2, which comprises two circuit branches 12 connected in parallel between a power supply source Vdd and ground and comprising, each, the series of two P-channel CMOS transistors 13 and 14 and two N-channel CMOS transistors 15 and 16.

Transistors 13, 14 and 15 have their gates connected to respective polarizations Vb1, Vb2 and Vb3, transistors 16 have their gates connected to inputs 2 and intermediate branch points between transistors 14 and 15 are connected to outputs 6.

Figure 3:
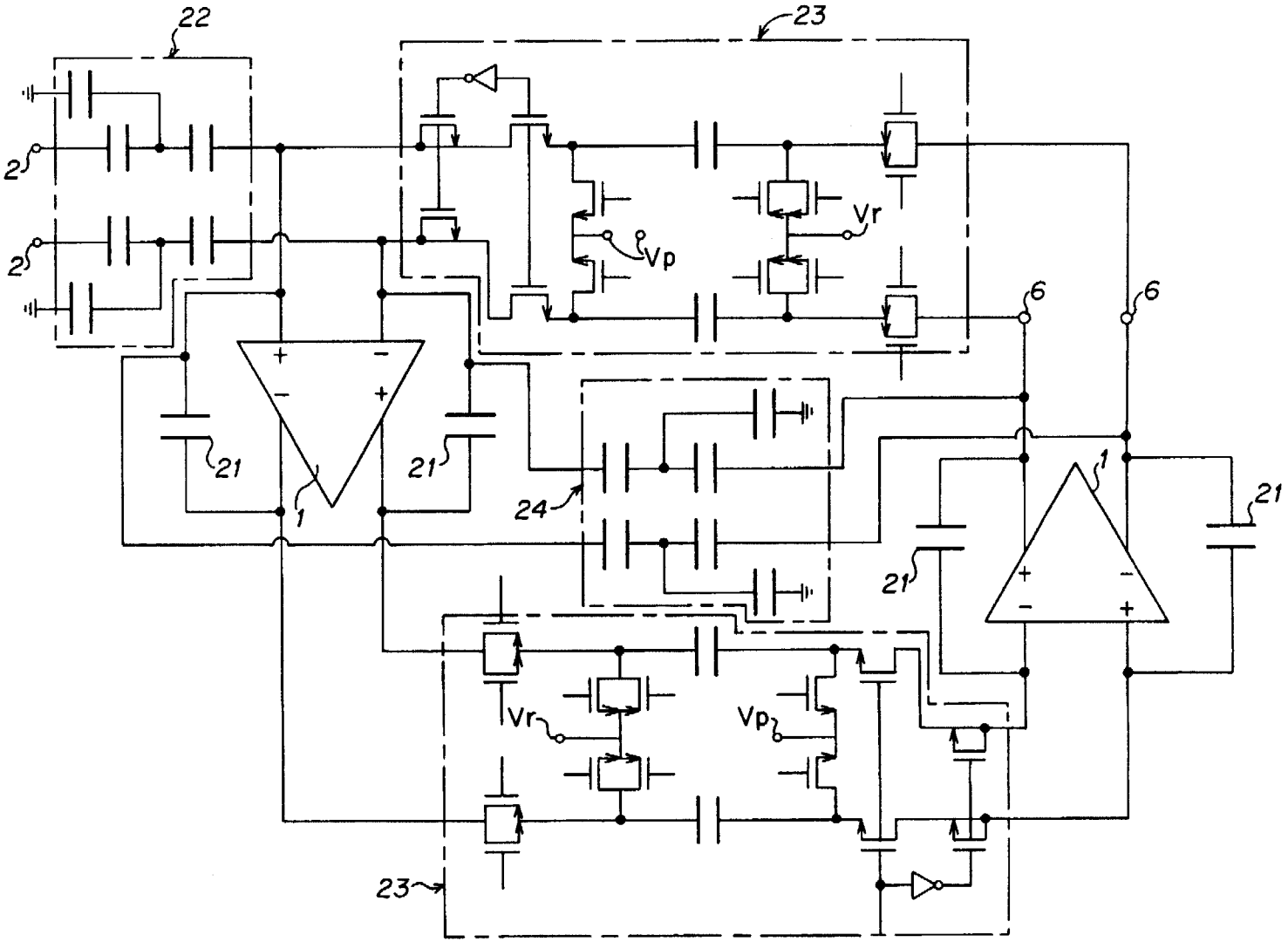
FIG. 3 shows a unit consisting of a completely differential band-pass filter of the second order, accomplished according to the invention.

As an alternative to the use hypothesized in FIG. 1, an operational amplifier like that of FIG. 2 or analogous, that is, without a CMFB circuit, may be used for each of the two completely differential operational amplifiers 1, included in the second-order band-pass filter of FIG. 3.

The filter of FIG. 3, also known in itself except for the type of operational amplifier used, comprises two amplifiers 1, each with two feedback condensers 21, an input coupling circuit 22 of the capacitative type, two switched-capacity circuits 23 with MOS transistors and capacities having polarization voltage Vp and reference voltage Vr and a multiplier circuit 24 of the capacitative type.

It appears evident that the two circuits 23 and one of the amplifiers 1 form the differential feedback network for the other amplifier 1, also performing for it the same function of the common-mode feedback. More precisely, the common-mode output of each operational amplifier is forced towards the reference voltage Vr, which must be selected so as to be half the power supply voltage so as to optimize the output dynamics and must be referenced to the negative power supply so as to improve the power supply's differential suppression ratio for the same negative power supply. This is a fundamental condition for utilizing operational amplifiers such as that of FIG. 2 without amplifying the noise on the negative power supply at the filter's output.

I claim:

1. Completely differential filter with switched condensers, comprising at least one completely differential operational amplifier having two inputs and two outputs and at least one pair of feedback circuits arranged to connect said outputs with respective inputs of said amplifier outside of same, characterized in that said operational amplifier has no common-mode circuit and in that the latter's function is performed by said pair of feedback circuits external to said amplifier and further characterized in that said operational amplifier is formed by two series of CMOS transistors connected between a voltage supply and ground and having an intermediate branch point connected to respective outputs of said amplifier, one of the transistors of each series having its gate connected to a respective input of said amplifier.

*2. A completely differential filter, comprising:*

*at least one differential operational amplifier having two inputs, two outputs, and no internal common-mode feedback circuit;*

*first and second feedback circuits coupled between a respective output and input of the differential operational amplifier;*

*wherein the operational amplifier includes at least two amplifying means, connected in parallel, between a voltage supply and ground; and*

*wherein the first and second feedback circuits provide common-mode feedback between the respective inputs and the respective outputs.*

*3. The filter of claim 2, wherein each amplifying means includes at least a first and a second series connected transistor element, the first transistor element including a control connection coupled to a respective input of the operational amplifier.*

*4. The filter of claim 3, wherein an intermediate node between each of the first and second series transistor elements is coupled to a respective output of the operational amplifier.*

*5. The filter of claim 2, wherein each of the first and second feedback circuits includes a first condenser coupled between the respective input and the respective output of the operational amplifier.*

*6. The filter of claim 5, wherein the first and second feedback circuits further comprise a second condenser coupled between a pole of a first single pole double throw switch and a pole of a second single pole double throw switch.*

*7. The filter of claim 6, wherein a first throw of the first single pole double throw switch is coupled to the respective operational amplifier input and a second throw of the first single pole double throw switch is coupled to a polarization voltage.*

*8. The filter of claim 7, wherein a first throw of the second single pole double throw switch is coupled to the respective operational amplifier output and the second throw of the second single pole double throw switch is coupled to a reference voltage.*

*9. The filter of claim 8, wherein the reference voltage is one half of the polarization voltage.*

*10. The filter of claim 4, wherein the first transistor element is an N-channel CMOS transistor.*

*11. The filter of claim 10, wherein the second transistor is a P-channel CMOS transistor.*

*12. A completely differential band-pass filter, comprising:*

*at least two differential operational amplifiers, each differential operational amplifier having two inputs, two outputs and no internal common-mode feedback circuit;*

*a first and second feedback condenser coupled between a respective input and a respective output of the respective operational amplifier;*

*a first and second pair of switched feedback circuits, the first pair of feedback circuits being coupled between the outputs of a first differential operational amplifier and the inputs of the second differential operational amplifier, the second pair of switched feedback circuits being coupled between the outputs of the second differential operational amplifier and the inputs of the first differential operational amplifier; and*

*wherein the operational amplifier includes at least two amplifying means, connected in parallel between a voltage supply and ground.*

*13. The filter of claim 12, wherein each amplifying means includes at least a first and a second series connected transistor element, the first transistor element including a control connection coupled to a respective input of the operational amplifier.*

*14. The filter of claim 13, wherein an intermediate node between each of the first and second series transistor elements is coupled to a respective output of the operational amplifier.*

*15. The filter of claim 14, wherein the first transistor element is an N-channel CMOS transistor.*

*16. The filter of claim 15, wherein the second transistor is a P-channel CMOS transistor.*

*17. The band pass filter of claim 12, further comprising a multiplier circuit coupled between the outputs of the first operational amplifier and the inputs of the second operational amplifier.*

*18. A completely differential filter, comprising:*

*at least one differential operational amplifier having two inputs, two outputs, and no internal common-mode feedback circuit;*

*first and second feedback circuits coupled between a respective output and input of the differential operational amplifier; and*

*wherein the first and second feedback circuits provide common-mode feedback between the respective inputs and the respective outputs.*

*19. A completely differential band-pass filter, comprising:*

*at least two differential operational amplifiers, each differential operational amplifier having two inputs, two outputs and no internal common-mode feedback circuit;*

*a first and second feedback condenser coupled between a respective input and a respective output of the respective operational amplifier; and*

*a first and second pair of switched feedback circuits, the first pair of feedback circuits being coupled between the outputs of a first differential operational amplifier and the inputs of the second differential operational amplifier, a second pair of switched feedback circuits being coupled between the outputs of the second differential operational amplifier and the inputs of the first differential operational amplifier.*

*20. The filter of claim 18, wherein each of the first and second feedback circuits includes a first condenser coupled between the respective input and the respective output of the operational amplifier.*

* * * * *